United States Patent [19]

Bebernes et al.

[11] Patent Number: 4,629,911
[45] Date of Patent: Dec. 16, 1986

[54] LATCHING COMPARATOR

[75] Inventors: Linda K. Bebernes; Frederick G. Weiss, both of Portland, Oreg.

[73] Assignee: Tektronix, Inc., Beaverton, Oreg.

[21] Appl. No.: 711,884

[22] Filed: Mar. 15, 1985

[51] Int. Cl.⁴ .............................................. H03K 5/24
[52] U.S. Cl. .................................... 307/362; 307/530; 307/279
[58] Field of Search ............... 307/279, 362, 530, 350

[56] References Cited

U.S. PATENT DOCUMENTS 4,549,100 10/1985 Spence ................................. 307/530

Primary Examiner—John Zazworsky
Attorney, Agent, or Firm—William S. Lovell; John P. Dellett; John D. Winkelman

[57] ABSTRACT

A comparator includes a source degenerated latching differential amplifier and an input differential amplifier interconnected in stacked fashion and connected with the input amplifier having inverting and non-inverting outputs coupled respectively for positive feedback to the inverting and non-inverting inputs of the latching amplifier. Means are provided to limit the relative difference between the signals at the inverting and non-inverting inputs to the latching amplifier so that when the latching amplifier is activated a minimum current will always be present in both sides of the samplifier. Means are provided to selectively apply or not apply a common bias current to the latching amplifier such that on application thereof, the positive feedback from the input amplifier outputs causes the latching amplifier to drive the highest input amplifier output to a high voltage level limit and to drive the lowest input amplifier output to a low voltage level limit. The input amplifier outputs are maintained at such high and low levels until the bias current is switched away from the latching amplifier.

10 Claims, 2 Drawing Figures

LATCHING COMPARATOR

BACKGROUND OF THE INVENTION

The present invention relates in general to latching comparators and in particular to a latching comparator capable of high frequency operation.

Latching comparators generate a digital output signal indicating when an applied input voltage exceeds an applied reference voltage at the end of a first portion of an applied clocking signal, the output signal being latched in its current state during a second portion of the clocking signal. Latching comparators of the prior art typically include an input differential amplifier stage driving a latching amplifier stage, wherein the latter is provided with positive feedback. During the first portion of the clock cycle, bias current is provided to the input stage, while in a second portion of the clock cycle bias current is switched to the latching amplifier leaving the input amplifier de-energized.

One problem associated with such latching comparators relates to the time required for input and reference voltages to recharge the input capacitances of the input amplifier since these capacitances are charged to a large negative voltage during the second portion of the clock cycle when the input amplifier is off. This charging time limits the frequency of operation of the circuit by placing a lower limit on the length of the first portion of the clock cycle. Another problem relates to "strobe kickout", a transient signal at the first stage input due to charging or discharging of the parasitic capacitance associated with the first stage when the bias current is switched on or off.

What is needed, and would be useful, is a high frequency latching comparator having minimal response delay due to input capacitance charging time and exhibiting minimal strobe kickout.

SUMMARY OF THE INVENTION

According to the present invention in a particular embodiment thereof, a latching comparator comprises an input differential amplifier and a latching differential amplifier connected in stacked fashion such that bias currents passing through the latching amplifier also pass through the input amplifier. An inverting output of the input differential amplifier is positively fed back to an inverting input of the latching amplifier while a non-inverting output of the input amplifier is positively fed back to the non-inverting input of the latching amplifier. The relative difference between the signals fed back to the latching amplifier is limited to a value less than that required to switch the latching amplifier all the way to one state or the other.

Bias current from a current source may be selectively passed through both the input amplifier and the latching amplifier in series or through the input amplifier only, bypassing the latching amplifier. When the bias current bypasses the latching amplifier, the inverting and non-inverting output voltages of the input amplifier are proportional to the differential between input and reference voltages applied to inverting and non-inverting inputs of the input amplifier. As the bias current is diverted through the latching amplifier, the positive feedback from the input amplifier outputs causes the latching amplifier to drive the highest input amplifier output to a high voltage level limit and to drive the lowest input amplifier output to a low voltage level limit. The input amplifier outputs are maintained at such high and low levels by the positive feedback until the bias current is again diverted from the latching amplifier, the output levels thereafter being controlled as before by the relative difference between input and reference voltage signals.

Since the bias current continuously passes through the input differential amplifier, input capacitances associated with the input differential amplifier are continuously charged during the latch cycle and there is little delay in input differential amplifier response due to input capacitance charging time when the latch is deactivated. Also since the parasitic capacitances associated with the input differential amplifier are continuously charged, there is minimal strobe kickout following load current switching operation.

It is accordingly an object of the present invention to provide a new and improved latching comparator wherein response delay due to input capacitance charging time is minimized.

It is another object of the present invention to provide a new and improved latching comparator wherein transient coupling of strobe to input due to amplifier parasitic capacitance charging and discharging is minimized.

The subject matter of the present invention is particularly pointed out and distinctly claimed in the concluding portion of this specification. However, both the organization and method of operation, together with further advantages and objects of the invention, may best be understood by reference to the following description taken in connection with accompanying drawings wherein like reference characters refer to like elements.

DETAILED DESCRIPTION

Figure 1:
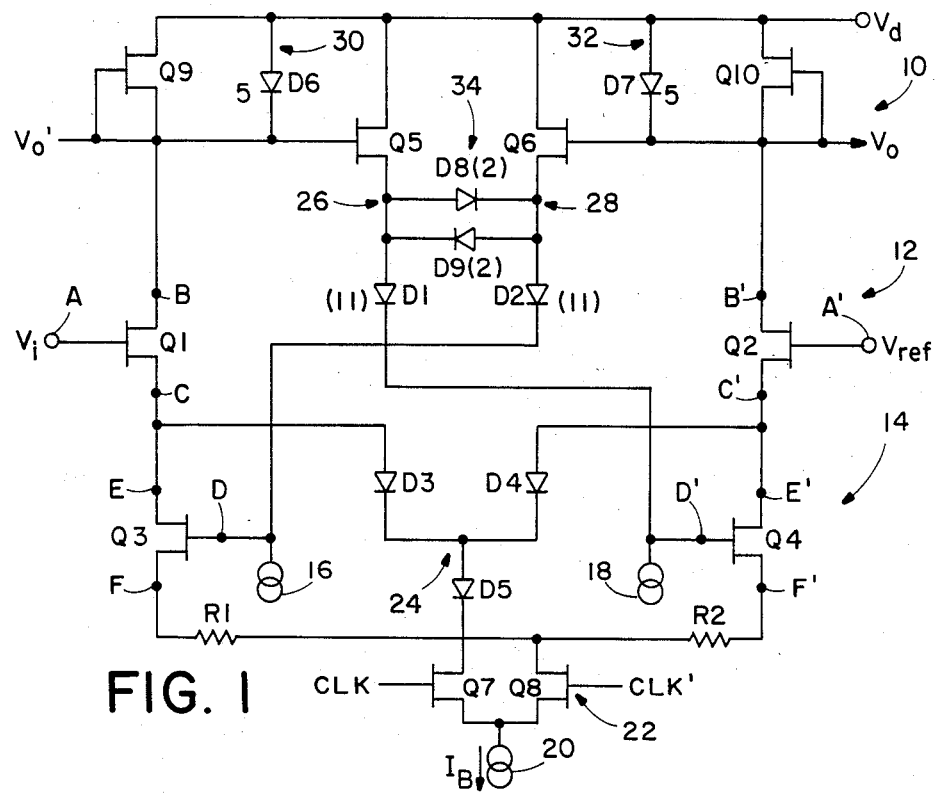
FIG. 1 is a circuit diagram of a latching comparator according to the present invention.

Referring to FIG. 1, a latching comparator 10, illustrated in schematic diagram form, is adapted to generate a digital output signal Vo indicating when an applied input voltage $V_i$ exceeds an applied reference voltage $V_{ref}$ at the end of a first, high logic level portion of an applied bi-state clocking CLK signal. The output signal is latched in its current state during a second, low logic level portion of the CLK signal.

Comparator 10 comprises input differential amplifier 12, including field effect transistors (FETs) Q1 and Q2, and latching differential amplifier 14, including FETs Q3 and Q4, degeneration resistors R1 and R2, and cross-coupled diode clamps D8 and D9. The input signal voltage $V_i$ is applied to a non-inverting input terminal A of input amplifier 12, at the gate of Q1, while the reference voltage Vref is applied to an inverting input terminal A' of input amplifier 12, i.e. at the gate of Q2. Terminals C and C' of input amplifier 12, at the sources of Q1 and Q2 respectively, are connected to inverting E and non-inverting E' output terminals of latching amplifier 14, at the drains of Q3 and Q4 respectively, such that input differential amplifier 12 is "vertically stacked" on latching differential amplifier 14 whereby the amplifiers 12 and 14 may share the same bias currents.

An inverting output terminal B of input amplifier 12, the drain of Q1, is connected to the gate of source-follower FET Q5, while the source of FET Q5 is connected to an inverting input D' of latching amplifier 14 at the gate of FET Q4 through a series of eleven diodes D1. Similarly, a non-inverting output terminal B' of input amplifier 12, at the drain of Q2, is connected to the gate of source-follower FET Q6, with the source of FET Q6 being connected through another series of eleven diodes D2 to a non-inverting input terminal D of latching amplifier 14, i.e. at the gate of FET Q3. The sources of source-follower FETS Q5 and Q6 are connected through two sets of two diodes. Diodes D8 are connected with their anodes at the source of FET Q5 and their cathodes at the source of FET Q6. Diodes D9 are connected with anodes at the source of FET Q6 and cathodes at the source of FET Q5.

A first constant current source 16 is connected to the gate of Q3 and a second constant current source 18 is connected to the gate of Q4. FET Q5, diodes D1 and current source 18 comprise a means 26 to provide buffered, level-shifted voltage feedback of inverting output voltage Vo' at output terminal B of amplifier 12 to the inverting input terminal D' of amplifier 14. Similarly, FET Q6, diodes D2 and current source 16 comprise a means 28 to provide buffered, level-shifted voltage feedback of non-inverting output voltage Vo at output terminal B' of amplifier 12 to input terminal D of amplifier 14. Diodes D8 and D9 comprise a means 34 to limit the difference between the two signals appearing at input terminals D and D' of amplifier 14.

The gate and source of an FET Q9 are connected to the inverting output B of input amplifier 12, and the gate and source of an FET Q10 are connected to non-inverting output B' of amplifier 12. An externally generated supply voltage Vd is applied to the drains of FETs Q9 and Q10. A set of five series-connected diodes D6 connects supply voltage Vd in the forward direction to inverting output B of amplifier 12, while a second series of five diodes D7 connects Vd to the non-inverting output B' of amplifier 12.

Diodes D3, D4 and D5 comprise means 24 to couple the sources of Q1 and Q2. The source of Q1, terminal C of amplifier 12, is connected to the anode of diode D3 and the source of Q2, terminal C' of amplifier 12, is connected to the anode of diode D4, the cathodes of diodes D3 and D4 being connected in common to the anode of diode D5. The cathode of diode D5 is connected to the drain of an FET Q7. The sources of FETs Q3 and Q4, terminals F and F' of latching amplifier 14, are applied in common to the drain of an FET Q8 through respective degaseration resistors R1 and R2, and the sources of FETs Q7 and Q8 are connected in common to constant bias current source 20. The CLK signal, which may be either a high (logical 1) or a low (logical 0) voltage, is applied to the gate of Q7 with its complement CLK' being applied to the gate of Q8.

Transistors Q7 and Q8 act in concert as a switch means 22 to supply bias current from current source 20 to the sources of Q3 and Q4, terminals F and F' of amplifier 14, when the CLK signal is low, and to supply bias current from current source 20 to the sources of Q1 and Q2, terminals C and C' of amplifier 12, through diodes D3, D4 and D5, when the CLK signal is high. Since input differential amplifier 12 is vertically stacked on latching amplifier 14 respectively, the bias current from current source constantly passes through amplifier 12 regardless of the state of the clock signal, either through diodes D3, D4 and D5 (coupling means 24), when the CLK signal is high, or through latching amplifier 14 respectively, when the CLK signal is low. when the CLK signal is high, Q7 is active and the sources of Q1 and Q2 are coupled through D3 and D4 to form a common source pair. Q1 and Q2 thus connected form differential amplifier 12 controlling the output voltages Vo and Vo' according to the relative difference between $V_i$ and $V_{ref}$. If $V_i$ is higher than $V_{ref}$, more of the bias current IB is diverted through Q1, pulling Vo' down and allowing Vo to move upwards towards Vd. FET Q9 and diodes D6 comprise a load and level clamp 30, with FET Q9 providing load resistance for Q1, clamping diodes D6 limiting the downward drop of Vo' by the permissible forward drop across the diodes. Conversely, if $V_i$ is lower than $V_{ref}$, more of the load current is diverted through Q2, pulling Vo down, as limited by load and level clamp 32 comprising FET Q10 and clamping diodes D7, and allowing Vo' to move upwards. when the CLK pulse is high, terminals F and F' of latching amplifier Q14 are uncoupled from current source 20 by 08, and therefore amplifier 14 draws no load current and has no effect on the output voltage Vo. Thus, as long as the CLK signal is high, Vo and Vo' are functions of the difference between $V_i$ and $V_{ref}$ as limited by load and level clamps 30 and 32.

When the CLK signal goes low, Q7 switches off and Q8 switches on, thereby directing bias current $I_B$ through Q3 and Q4. Since Q7 is off, the sources of Q1 and Q2, terminals C and C' of amplifier 12, are uncoupled and Q1 and Q2 no longer act as a differential amplifier. The current passing through Q1 and Q3 is largely controlled by the relative differences in voltages at the gates of Q3 and Q4 and is not strongly affected by any changes in $V_i$ at the gate of Q1. Similarly, the current passing through Q2 and Q4 is primarily a function of the relative differences in voltages at the gate of Q4 and Q3 rather than of the magnitude of $V_{ref}$. With Q3 and Q4 active, the relative differences between the output voltages Vo and Vo', buffered by source-followers Q6 and Q5, level shifted by diodes D2 and D1, and limited by diode clamps D8 and D9 controls the current flow in Q3 and Q4. Degenerating source resistors R1 and R2 are provided to decrease the gain of amplifier 14 so that a greater relative difference between the inputs D and D' to the amplifier is required to cause all of the bias current $I_B$ to flow in one side or the other of the amplifier. Diode clamps D8 and D9 limit the relative difference between the inputs to the latching amplifier 14 such that the bias current $I_B$ will never be diverted entirely to one side. If, at the moment the CLK signal goes low, $V_i$ is higher in voltage than $V_{ref}$, such that Vo is higher than Vo', the voltage fed back to the gate of Q3 through buffer and level shifter 28 is higher than the voltage fed back to the gate of Q4 whereby Q3 begins to draw more current than Q4, driving Vo' lower and Vo higher. This positive feedback arrangement rapidly causes Vo to rise to its maximum voltage level and causes Vo' to drop to its lowest level determined by the maximum relative difference in currents set by diode clamps D8 and D9 and degeneration resistors R1 and R2. Alternatively, if at the moment the CLK signal goes low, $V_i$ is lower in voltage than $V_{ref}$ such that Vo is lower than Vo', the voltage fed back to the gate of Q3 is lower than the voltage fed back to the gate of Q4, and Q3 begins to draw less current than Q4 driving Vo lower and driving Vo' higher until the voltage limits are reached. Any subsequent change in $V_i$ with respect to $V_{ref}$ has no effect in moving Vo and Vo' from their clamped limits. Therefore Q3 and Q4 act to latch the output state of comparator 10 while the CLK signal is low. Once the CLK signal goes high again, the latching effect of latching amplifier 14 is ended, and control of Vo and Vo' is returned to input amplifier 12.

With limiter diodes D8 and D9 and degeneration resistors R1 and R2 provided to ensure both Q1 and Q2 remain active when the latch amplifier 14 is active, regardless of the state of the CLK signal, gate-to-source and drain-to-source capacitances associated with Q1 and Q2 are continuously charged to a relatively constant value. Thus there is minimal delay in input differential amplifier 12 response due to input capacitance charging time as well as minimal strobe kickout at the time the latch amplifier 14 is deactivated.

Figure 2:
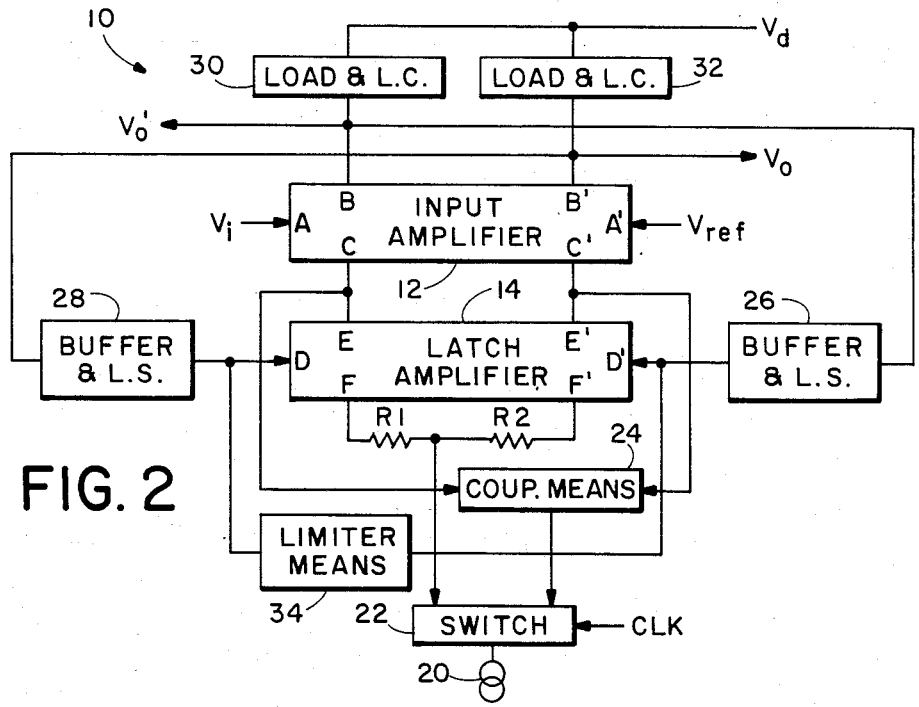
FIG. 2 is a block diagram of a latching comparator according to the present invention.

The circuit of FIG. 1 is depicted in a more generalized block diagram form in FIG. 2. The preferred embodiment of the present invention, as depicted in FIGS. 1 and 2, employs FETs, but alternative embodiments of the present invention may be implemented according to the topology of FIG. 2 using bipolar, NMOS, CMOS or other technologies wherein circuits having the functional properties of each of the blocks of FIG. 2 are employed.

Referring to FIG. 2, input differential amplifier 12 is stacked on latching differential amplifier 14 such that terminal C of input amplifier 12 is connected to inverting output terminal E of latching amplifier 14 and such that terminal C' of input amplifier 12 is connected to non-inverting terminal E' of latching amplifier 14. Input voltage $V_i$ is applied to a non-inverting input A of amplifier 12 while the reference voltage $V_{ref}$ is applied to an inverting input A'. The terminals C and C' of input amplifier 12 are coupled by coupling means 24 to one terminal of switch means 22, with terminals F and F' of latching amplifier 14 being connected through degeneration resistors R1 and R2 to another terminal of switch means 22. Switch means 22 alternately applies bias current source 20 to latching amplifier 14 or input amplifier 12 terminals according to the state of an applied CLK signal. The inverting output B of input amplifier 12 is fed back to the inverting input D' of latching amplifier 14 through buffering and level shifting means 26 while the non-inverting output B' of input amplifier 12 is fed back to the non-inverting input D of latching amplifier 14 through buffering and level shifting means 28. The relative difference between the fed back signals from inverting output B and non-inverting output B' is limited by limiter means 34. Load and level shifting means 30 and 32 across which Vo' and Vo respectively are established are connected between supply voltage Vd and the inverting and non-inverting outputs of amplifier 12.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:
1. A comparator comprising:
a latching differential amplifier having inverting and non-inverting inputs and outputs;
an input differential amplifier having inverting and non-inverting outputs proportional to the difference between an applied input voltage and an applied reference voltage for receiving an input and for driving the latching amplifier, said input amplifier being connected to the latching amplifier such that a bias current passing through the input amplifier may pass through the latching amplifier, said input amplifier outputs being coupled to the latching amplifier inputs to provide positive feedback;
means for switching the bias current passing through the input amplifier such that it does not also pass through the latching amplifier; and
means to limit a voltage difference between said inverting and non-inverting inputs of said latching differential amplifier.

2. A comparator as in claim 1 further comprising:
means to limit the gain of said latching amplifier such that portions of said bias current pass through both inverting and non-inverting inputs of said latching amplifier.

3. A comparator as in claim 1 further comprising:
a voltage source,
first load and level clamping means connected between the voltage source and the inverting output of the input differential amplifier, and
second load and level clamping means connected between the voltage source and the noninverting output of the input differential amplifier.

4. A comparator as in claim 1 wherein the input amplifier outputs are coupled to the latching amplifier inputs by level shifting means.

5. A comparator as in claim 1 wherein the input amplifier outputs are coupled to the latching amplifier inputs by buffering means.

6. A comparator as in claim 1 wherein the input amplifier outputs are coupled to the latching amplifier inputs by buffering and level shifting means.

7. A comparator comprising:
a latching differential amplifier having inverting and non-inverting inputs and outputs,
an input differential amplifier, having inverting and non-inverting outputs proportional to the difference between an applied input voltage and and applied reference voltage,
the input and latching amplifiers being connected such that a bias current passing through the input amplifier also passes through the latching amplifier, said input amplifier outputs being coupled to said latching amplifier inputs to provide positive feedback, and
means to limit the gain of said latching amplifier such that said bias current does not pass entirely through said inverting output of said latching amplifier or entirely through said non-inverting output of said latching amplifier.

8. A comparator as in claim 7 further comprising:
means to selectively divert said bias current passing through the input amplifier such that it does not also pass through the latching amplifier.

9. A comparator as in claim 7 further comprising:
means to limit a voltage difference between said latching amplifier inputs.

10. A comparator comprising:
a latching differential amplifier having inverting and non-inverting inputs and outputs,
an input differential amplifier having inverting and non-inverting outputs proportional to the difference between an applied input voltage and an applied reference voltage, the input and output amplifiers being connected such that bias current passing through the input amplifier also passes through the latching amplifier;

buffering and level shifting means to couple said input amplifier outputs to the latching amplifier inputs;

meahs to limit the gain of said latching amplifier such that said bias current does not pass entirely through either said inverting output or said non-inverting output of said amplifier;

means to selectively divert the bias currents passing through the input amplifier such that they do not also pass through the latching amplifier, first load and level clamping means connected between the inverting output of the input differential amplifier and a voltage source, second load and level clamping means connected between the non-inverting output of the input differential amplifier and a voltage source, and means to limit a voltage difference between said inputs of said latching amplifier.

* * * * *